US012765276B2

(12) United States Patent
Fleury et al.

(10) Patent No.: US 12,765,276 B2
(45) Date of Patent: Oct. 13, 2026

(54) SWITCH BASED ON PHASE-CHANGE MATERIAL

(71) Applicants: COMMISSARIAT A L'ENERGIE ATOMIQUE ET AUX ENERGIES ALTERNATIVES, Paris (FR); STMicroelectronics (Crolles 2) SAS, Crolles (FR); STMicroelectronics France, Montrouge (FR)

(72) Inventors: Alain Fleury, Barberaz (FR); Stephane Monfray, Eybens (FR); Philippe Cathelin, Laval (FR); Bruno Reig, Grenoble (FR); Vincent Puyal, Grenoble (FR)

(73) Assignees: COMMISSARIAT A L'ENERGIE ATOMIQUE ET AUX ENERGIES ALTERNATIVES, Paris (FR); STMicroelectronics (Crolles 2) SAS, Crolles (FR); STMicroelectronics France, Montrouge (FR)

( * ) Notice: Subject to any disclaimer, the term of this patent is extended or adjusted under 35 U.S.C. 154(b) by 811 days.

(21) Appl. No.: 18/190,901

(22) Filed: Mar. 27, 2023

(65) Prior Publication Data

US 2024/0023468 A1 Jan. 18, 2024

(30) Foreign Application Priority Data

Jul. 18, 2022 (FR) ...................................... 2207296
Jul. 18, 2022 (FR) ...................................... 2207297
Jul. 18, 2022 (FR) ...................................... 2207298

(51) Int. Cl.
*H10N 70/00* (2023.01)
*H10N 70/20* (2023.01)

(52) U.S. Cl.
CPC ......... *H10N 70/823* (2023.02); *H10N 70/011* (2023.02); *H10N 70/063* (2023.02);
(Continued)

(58) Field of Classification Search
CPC ............... H10N 70/826; H10N 70/231; H10N 70/8413; H10N 70/882
See application file for complete search history.

(56) References Cited

U.S. PATENT DOCUMENTS 7,545,252 B1 6/2009 Lantz
7,755,899 B2 7/2010 Stenmark
(Continued)

FOREIGN PATENT DOCUMENTS

EP 3457491 A1 3/2019

OTHER PUBLICATIONS

Crunteanu et al., "Out-of-Plane and Inline RF Switches based on $Ge_2Sb_2Te_5$ Phase-Change Material," IEEE, 2014. (4 pages).
(Continued)

*Primary Examiner* — Thomas E Lazo

(74) *Attorney, Agent, or Firm* — Seed Intellectual Property Law Group LLP

(57) ABSTRACT

The present description concerns a switch based on a phase-change material comprising: a region of the phase-change material; a heating element electrically insulated from the region of the phase-change material; and one or a
(Continued)

plurality of pillars extending in the region of the phase-change material, the pillar(s) being made of a material having a thermal conductivity greater than that of the phase-change material.

20 Claims, 5 Drawing Sheets

(52) U.S. Cl.
CPC ......... *H10N 70/231* (2023.02); *H10N 70/253* (2023.02); *H10N 70/841* (2023.02); *H10N 70/8413* (2023.02); *H10N 70/861* (2023.02); *H10N 70/8613* (2023.02); *H10N 70/8828* (2023.02)

(56) References Cited

U.S. PATENT DOCUMENTS

| | | | |
|---|---|---|---|
| 9,368,720 B1 * | 6/2016 | Moon | H10N 70/8828 |
| 9,934,922 B2 | 4/2018 | Reig et al. | |
| 10,461,253 B1 | 10/2019 | Slovin et al. | |
| 10,490,374 B2 | 11/2019 | Borodulin et al. | |
| 10,644,067 B2 | 5/2020 | Reig et al. | |
| 2006/0102927 A1 | 5/2006 | Fujita et al. | |
| 2007/0096248 A1 | 5/2007 | Philipp et al. | |
| 2009/0040007 A1 * | 2/2009 | Stenmark | H01H 37/46 337/324 |
| 2011/0038093 A1 | 2/2011 | Furukawa et al. | |
| 2012/0181499 A1 | 7/2012 | Chuang et al. | |
| 2014/0191181 A1 * | 7/2014 | Moon | H10N 70/011 257/4 |
| 2015/0041917 A1 | 2/2015 | Zhu et al. | |
| 2016/0079019 A1 * | 3/2016 | Borodulin | H10N 70/231 337/396 |
| 2017/0365427 A1 * | 12/2017 | Borodulin | H10N 70/8613 |
| 2018/0005786 A1 * | 1/2018 | Navarro | H01P 1/184 |
| 2018/0138894 A1 | 5/2018 | Belot et al. | |
| 2018/0159530 A1 | 6/2018 | Englekirk | |
| 2019/0088721 A1 * | 3/2019 | Reig | H01P 1/10 |
| 2021/0035639 A1 * | 2/2021 | Cohen | H10N 70/8613 |
| 2021/0135100 A1 * | 5/2021 | Slovin | H10N 70/841 |
| 2021/0320250 A1 * | 10/2021 | Heiss | H10N 70/823 |
| 2021/0376234 A1 * | 12/2021 | Heiss | H10N 70/8613 |
| 2022/0199343 A1 | 6/2022 | Taddiken et al. | |
| 2022/0285614 A1 | 9/2022 | Li et al. | |
| 2023/0337554 A1 | 10/2023 | Wohlmuth et al. | |
| 2023/0343531 A1 | 10/2023 | Solomko et al. | |
| 2024/0023465 A1 | 1/2024 | Reig et al. | |
| 2024/0023467 A1 | 1/2024 | Monfray et al. | |
| 2024/0186090 A1 | 6/2024 | Cathelin et al. | |
| 2024/0276897 A1 | 8/2024 | Chen et al. | |

OTHER PUBLICATIONS

El-Hinnawy et al., "A 25 THz $F_{CO}$ (6.3 fs $R_{ON}$* $C_{OFF}$) Phase-Change Material RF Switch Fabricated in a High Volume Manufacturing Environment with Demonstrated Cycling > 1 Billion Times," IEEE/MTT-S International Microwave Symposium, p. 45-48, 2020.

El-Hinnawy et al., "A Four-Terminal, Inline, Chalcogenide Phase-Change RF Switch Using an Independent Resistive Heater for Thermal Actuation," *IEEE Electron Device Letters* 34(10):1313-1315, Oct. 2013.

El-Hinnawy et al., "Experimental Demonstration of AlN Heat Spreaders for the Monolithic Integration of Inline Phase-Change Switches," *IEEE Electron Device Letters* 39(4):610-613, Apr. 2018.

El-Hinnawy et al., "Switch Stacking for OFF-State Power Handling Improvements in PCM RF Switches," 2021 IEEE/MTT-S International Microwave Symposium, p. 424-427.

Joseph et al., "Power Handling Capability of an SOI RF Switch," 2013 IEEE Radio Frequency Integrated Circuits Symposium, p. 385-388.

Léon et al., "High Performance and Low Energy Consumption in Phase Change Material RF Switches," Proceedings of the 48th European Microwave Conference, p. 401-404, 2018.

Léon et al., "RF Power-Handling Performance for Direct Actuation of Germanium Telluride Switches," *IEEE Transactions on Microwave Theory and Techniques* 68(1):60-73, Jan. 2020.

Mennai et al., "Bistable RF Switches Using $Ge_2Sb_2Te_5$ Phase Change Material," Proceedings of the 45th European Microwave Conference, p. 45-47, 2015.

Moon et al., "5 THz Figure-of-Merit Reliable Phase-change RF Switches for Millimeter-wave Applications," 2018 IEEE/MTT-S International Microwave Symposium, p. 836-838, 2018.

Slovin et al., "Phase-Change Material RF Switches and Monolithic Integration in 180 nm RF-SOI CMOS Processes," 2021 IEEE International Electron Devices Meeting (IEDM), 2021. (4 pages).

Wainstein et al., "Compact Modeling and Electrothermal Measurements of Indirectly Heated Phase-Change RF Switches," *IEEE Transactions on Electron Devices* 67(11):5182-5187, Nov. 2020.

Wainstein et al., "Indirectly Heated Switch as a Platform for Nanosecond Probing of Phase Transition Properties in Chalcogenides," *IEEE Transactions on Electron Devices* 68(3):1298-1303, Mar. 2021.

Young et al., "Improvements in GeTe-based Phase Change RF Switches," 2018 IEEE/MTT-S International Microwave Symposium, p. 832-835, 2018.

* cited by examiner

SWITCH BASED ON PHASE-CHANGE MATERIAL

CROSS-REFERENCE TO RELATED APPLICATION(S)

This application claims the priority benefit of French patent application number 2207296/2207297/2207298, filed on Jul. 18, 2022, entitled "Commutateur à base de matériau à changement de phase", which is hereby incorporated by reference to the maximum extent allowable by law.

BACKGROUND

Technical Background

The present disclosure generally concerns electronic devices. The present disclosure more particularly concerns switches based on a phase-change material capable of alternating between a crystal phase, electrically conductive, and an amorphous phase, electrically insulating.

Description of the Related Art

Many applications taking advantage of switches, or interrupters, based on a phase-change material to allow or prevent the flowing of an electric current in all or part of a circuit are known. Such switches may particularly be implemented in radio frequency communication applications, for example, to switch an antenna between transmit and receive modes, to activate a filter corresponding to a frequency band, etc.

BRIEF SUMMARY

There is a need to improve existing switches based on a phase-change material and their manufacturing methods.

An embodiment overcomes all or part of the disadvantages of known switches based on a phase-change material and of their manufacturing methods.

An aspect of an embodiment more particularly aims at providing a switch having an improved thermal efficiency.

An aspect of another embodiment more particularly aims at providing a switching having decreased dimensions.

An aspect of still another embodiment more particularly aims at providing a switch having an increased switching speed.

For this purpose, an embodiment provides a switch based on a phase-change material comprising:

a region made of said phase-change material;

an electrically-heating element insulated from the region of said phase-change material; and one or a plurality of pillars extending in the region of said phase-change material, the pillar(s) being made of a material having a thermal conductivity greater than that of said phase-change material.

According to an embodiment, the material of the pillar(s) is electrically insulating.

According to an embodiment, the material of the pillar(s) is selected from among aluminum nitride or silicon nitride.

According to an embodiment, said phase-change material is a chalcogenide material.

According to an embodiment, an electrically insulating layer is interposed between the heating element and the region of said phase-change material.

According to an embodiment, the electrically insulating layer is made of the same material as the pillar(s).

According to an embodiment, the region of said phase-change material is closer to a substrate, inside and on top of which is formed the switch, than the heating element.

According to an embodiment, the heating element is closer to a substrate, inside and on top of which is formed the switch, than the region of said phase-change material.

According to an embodiment, the region of said phase-change material is coated with a passivation layer.

According to an embodiment, the region of said phase-change material couples first and second conduction electrodes of the switch.

According to an embodiment, each pillar has a maximum lateral dimension equal to approximately 300 nm.

According to an embodiment, each pillar is separated from the neighboring pillars by a distance in the order of 300 nm.

Further, an embodiment provides a switch based on a phase-change material comprising:

a region of said phase-change material coupling first and second conduction electrodes of the switch;

an electrically-heating element insulated from the region of said phase-change material; and one or a plurality of islands made of an electrically insulating material each having a first surface extending on top of and in contact with the first and second electrodes, wherein the region of said phase-change material extends on sides and on a second surface, opposite to the first surface, of each island.

According to an embodiment, said sides of each island are substantially parallel to a conduction direction of the switch.

According to an embodiment, the switch comprises a single island made of said electrically insulating material.

According to an embodiment, the switch comprises a plurality of islands made of said electrically insulating material.

According to an embodiment, the islands are distributed at regular intervals along the heating element.

According to an embodiment, said electrically insulating material is aluminum nitride.

According to an embodiment, an electrically insulating layer, interposed between the region of said phase-change material and the heating element, coats all the sides of each island.

According to an embodiment, the region of said phase-change material coats all the sides of each island.

According to an embodiment, an electrically insulating layer, interposed between the region of said phase-change material and the heating element, coats the upper surface and the sides of the region of said phase-change material.

According to an embodiment, each island has a cross-section of trapezoidal shape.

According to an embodiment, each island has a height equal to approximately 5 μm.

According to an embodiment, the switch further comprises one or a plurality of pillars extending in the region of said phase-change material, the pillar(s) being made of a material having a thermal conductivity greater than that of said phase-change material.

An embodiment provides a method of forming a switch such as described, comprising a step of forming of the island(s) on top of and in contact with a portion of the upper surface of each control electrode.

Further, an embodiment provides a switch based on a phase-change material comprising:

first and second regions made of said phase-change material each connected to first and second conduction electrodes of the switch, the second region being located above the first region; and a heating element located between the first and second regions of said phase-change material and electrically insulated from the first and second regions of said phase-change material.

According to an embodiment, a region, among the first and second regions of said phase-change material, is on top of and in contact with the first and second electrodes.

According to an embodiment, the other region of said phase-change material is connected to the first and second electrodes by vias.

According to an embodiment, said vias are in contact, by their upper surface, with the lower surface of said other region of said phase-change material.

According to an embodiment, the other region of said phase-change material is under and in contact with third and fourth electrodes.

According to an embodiment, the third and fourth electrodes are respectively connected to the first and second electrodes by vias.

According to an embodiment, the heating element is made of metal or of a metal alloy.

According to an embodiment, the heating element is made of tungsten or of titanium nitride.

According to an embodiment, the switch further comprises one or a plurality of pillars extending in the first region of said phase-change material, the pillar(s) being made of a material having a thermal conductivity greater than that of said phase-change material.

According to an embodiment, the switch further comprises one or a plurality of pillars extending in the second region of said phase-change material, the pillar(s) being made of a material having a thermal conductivity greater than that of said phase-change material.

An embodiment provides a method of manufacturing a switch such as described, comprising the following successive steps:

a) deposition of the first region of said phase-change material;

b) forming of the heating element; and c) deposition of the second region of said phase-change material.

BRIEF DESCRIPTION OF THE SEVERAL VIEWS OF THE DRAWINGS

The foregoing and other features and advantages of the present disclosure will be discussed in detail in the following non-limiting description of specific embodiments in connection with the accompanying drawing, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the circuits for controlling switches based on a phase-change material and the applications where such switches may be provided have not been detailed, the described embodiments and variants being compatible with usual circuits for controlling switches based on a phase-change material and with usual applications implementing switches based on a phase-change material.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms “front”, “back”, “top”, “bottom”, “left”, “right”, etc., or relative positions, such as terms “above”, “under”, “upper”, “lower”, etc., or to terms qualifying directions, such as terms “horizontal”, “vertical”, etc., it is referred unless specified otherwise to the orientation of the drawings.

Unless specified otherwise, the expressions “about”, “approximately”, “substantially”, and “in the order of” signify plus or minus 10%, preferably of plus or minus 5%.

Figure 1:
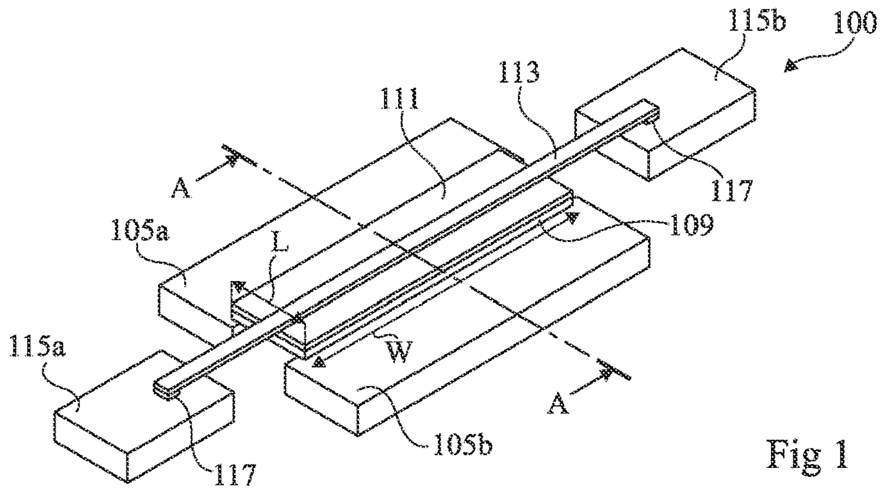
FIG. 1 is a simplified and partial perspective view of an example of a switch based on a phase-change material.
Figure 2:
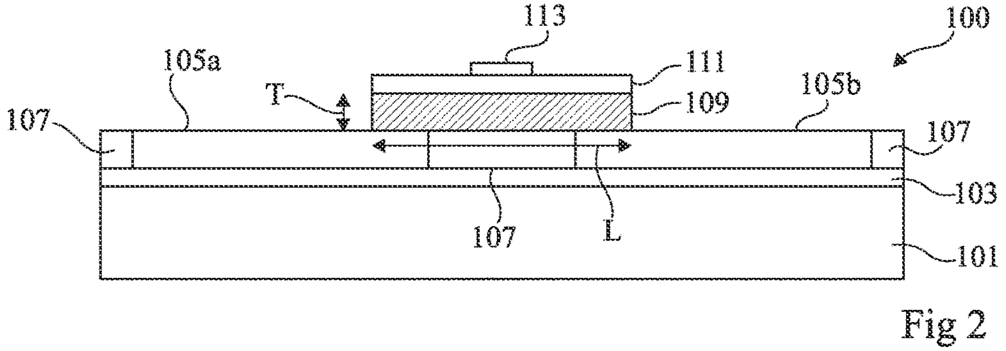
FIG. 2 is a cross-section view, along plane AA of FIG. 1, of the switch of FIG. 1.

FIG. 1 is a simplified and partial perspective view of an example of a switch 100 based on a phase-change material. FIG. 2 is a cross-section view, along plane AA of FIG. 1, of the switch 100 of FIG. 1. Plane AA of FIG. 1 is substantially parallel to a conduction direction of switch 100.

In the shown example, switch 100 is formed inside and on top of a substrate 101, for example, a wafer or a piece of wafer made of a semiconductor material. As an example, substrate 101 is made of silicon and has a resistivity in the order of 100 am (silicon said to have a "high resistivity").

In this example, substrate 101 is coated on one of its surfaces (its upper surface, in the orientation of FIG. 2) with an electrically insulating layer 103. As an example, layer 103 is made of silicon dioxide ($SiO_2$) and has a thickness in the order of 500 nm.

In the shown example, switch 100 comprises first and second conduction electrodes 105*a* and 105*b* located on top of and in contact with the upper surface of electrically insulating layer 103. Electrodes 105*a* and 105*b* are for example intended to be connected to a radio frequency communication circuit, not detailed in the drawings. A distance for example in the order of 1 μm separates electrode 105*a* from electrode 105*b*. Electrodes 105*a* and 105*b* are made of a conductive material, for example, a metal, for example, copper or aluminum, or of a metal alloy. Each electrode 105*a*, 105*b* may have a monolayer structure or a multilayer structure comprising for example, from the upper surface of layer 103, a titanium layer having a thickness in the order of 10 nm, a layer of a copper and aluminum alloy having a thickness in the order of 440 nm, another titanium layer having a thickness in the order of 10 nm, and a titanium nitride layer (TiN) having a thickness in the order of 100 nm.

In this example, another electrically insulating layer 107 coats portions of the upper surface of layer 103 not coated with electrodes 105*a* and 105*b*. In the illustrated example, the material of layer 107 surrounds electrodes 105*a* and 105*b* on all their lateral surfaces. A portion of layer 107 extends in particular between electrodes 105*a* and 105*b* and electrically insulates electrode 105*a* from electrode 105*b*. Layer 107 is for example flush with the upper surface of electrodes 105*a* and 105*b*, as illustrated in FIG. 2. As an example, layer 107 is made of the same material as layer 103, for example, silicon dioxide.

To avoid overloading the drawing, substrate 101 and electrically insulating layers 103 and 107 have not been shown in FIG. 1.

In the shown example, switch 100 further comprises a region 109 made of a phase-change material coupling the first and second conduction electrodes 105*a* and 105*b*. More precisely, in this example, region 109 coats the upper surface of the portion of layer 107 separating conduction electrodes 105*a* and 105*b* and further extends, for example over a distance in the order of 1 μm, on top of and in contact with a portion of the upper surface of each electrode 105*a*, 105*b*. Region 109 for example has a thickness T in the range from 100 to 300 nm.

As an example, region 109 of switch 100 is made of a material called "chalcogenide", that is, a material or an alloy comprising at least one chalcogen element, for example, a material from the family of germanium telluride (GeTe), of antimony telluride (SbTe), or of germanium-antimony-tellurium (GeSbTe, commonly designated with acronym "GST"). As a variant, region 109 is made of vanadium oxide ($VO_2$).

Generally, phase-change materials are materials capable of alternating, under the effect of a temperature variation, between a crystal phase and an amorphous phase, the amorphous phase having an electric resistance greater than that of the crystal phase. In the case of switch 100, advantage is taken of this phenomenon to obtain an off state, preventing the flowing of a current between conduction electrodes 105*a* and 105*b*, when a portion at least of the material of region 109 located between the conduction electrodes is in the amorphous phase, and an on state, allowing the flowing of the current between electrodes 105*a* and 105*b*, when the material of region 109 is in the crystal phase.

In the shown example, the upper surface of region 109 is coated with an electrically insulating layer 111. As an example, layer 111 is made of a dielectric and thermally conductive material, for example, silicon nitride (SiN) or aluminum nitride (AlN).

In this example, switch 100 further comprises a heating element 113 located on top of and in contact with the upper surface of layer 111, vertically in line with region 109 of phase-change material. Heating element 113 is electrically insulated from region 109 by layer 111. In the shown example, heating element 113 has the shape of a strip extending along a direction substantially orthogonal to the conduction direction of switch 100. In this example, the ends of heating element 113 are respectively connected to third and fourth control electrodes 115*a* and 115*b* of switch 100 by means of conductive pads 117. Heating element 113 for example has a thickness in the order of 100 nm. As an example, heating element 113 is made of a metal, for example, tungsten, or of a metal alloy, for example, titanium nitride.

Although this has not been illustrated in the drawings, the structure of switch 100 may be coated, on the upper surface side of substrate 101, with a thermally insulating layer intended to confine the heat generated by heating element 113.

During switchings between on and off state, the control electrodes 115*a* and 115*b* of switch 100 are for example intended to be submitted to a control voltage causing a current flow through heating element 113. This current causes, by Joule effect and then by radiation and/or conduction inside of the structure of switch 100, particularly through layer 111, a temperature rise of region 109 from its upper surface, located in front of heating element 113.

More precisely, to toggle switch 100 from the off state to the on state, region 109 is heated by means of heating element 113, for example, at a temperature T1 and for a duration d1. Temperature T1 and duration d1 are selected to cause a phase change of the material of region 109 from the amorphous phase to the crystal phase. Temperature T1 is for example higher than a crystallization temperature and lower than a melting temperature of the material of region 109. As an example, temperature T1 is in the range from 150 to 350° C. and duration d1 is shorter than 1 μs. In the case where region 109 is made of germanium telluride, temperature T1 is for example equal to approximately 300° C. and duration d1 is for example in the range from 100 ns to 1 μs.

Conversely, to toggle switch 100 from the on state to the off state, region 109 is heated by means of heating element 113, for example up to a temperature T2 higher than temperature T1, and for a duration d2 shorter than duration d1. Temperature T2 and duration d2 are selected to cause a phase change of the material of region 109 from the crystal phase to the amorphous phase. Temperature T2 is for example higher than the melting temperature of the phase-change material. As an example, temperature T2 is in the range from 600 to 1,000° C. and duration d2 is shorter than 500 ns. In the case where region 109 is made of germanium telluride, temperature T2 is for example equal to approximately 700° C. and duration d2 is for example equal to approximately 100 ns.

Switch 100 is said to be "indirectly heated", the temperature rise of the phase-change material being obtained by the flowing of a current through an electrically-heating element insulated from the phase-change material, as opposed to switches of "directly heated" type, which comprise no heating element and where the temperature rise results from a current flow directly through the phase-change material. In the case of a directly heated switch, the control electrodes are for example connected to two opposite sides of the region of phase-change material, for example, along a direction orthogonal to the conduction path of the switch. A disadvantage of directly heated switches lies in the fact that, when the switch is on, an electric conduction path is created through the phase-change material between the control electrodes and the conduction electrodes of the switch. This causes leakage currents, which disturb the signal transmitted between the conduction electrodes.

To respond to the constraints of various applications, for example in the field of radio frequency communications, it is desirable for switch 100 to have the lowest possible figure of merit. In the present disclosure, the figure of merit of a switch corresponds to a product of an on-state resistance $R_{ON}$ by an off-state capacitance $C_{OFF}$ of this switch.

The on-state resistance Ro N of the switches of the present disclosure is defined by the following relation:

$$R_{ON} = \frac{1}{\sigma_{ON}} \cdot \frac{L}{T \cdot W} \quad \text{[Math 1]}$$

In the above relation Math 1, L, W, and T respectively designate the length, the width, and the thickness of region 109 of phase-change material, length L and width W corresponding to dimensions of region 109 measured along directions respectively parallel and orthogonal to the conduction direction of the switch, and $\sigma_{ON}$ designates a conductivity of the phase-change material (expressed in Siemens per meter) when the latter is in its crystal phase.

To decrease the figure of merit of switch 100, its on-state resistance Ro N may for example be decreased by increasing the thickness T of region 109 of phase-change material. This would however cause an undesirable increase of switching durations, or a decrease in the switching speed, between the on and off states. Indeed, for a same control voltage, the thicker region 109 is, the longer the durations d1 and d2, respectively corresponding to the durations of transition between the amorphous phase and the crystal phase and between the crystal phase and the amorphous phase. To decrease durations d1 and d2, one may be tempted to increase the control voltage of heating element 113 but this would cause an undesirable increase in the energy consumption of switch 100.

Figure 3:
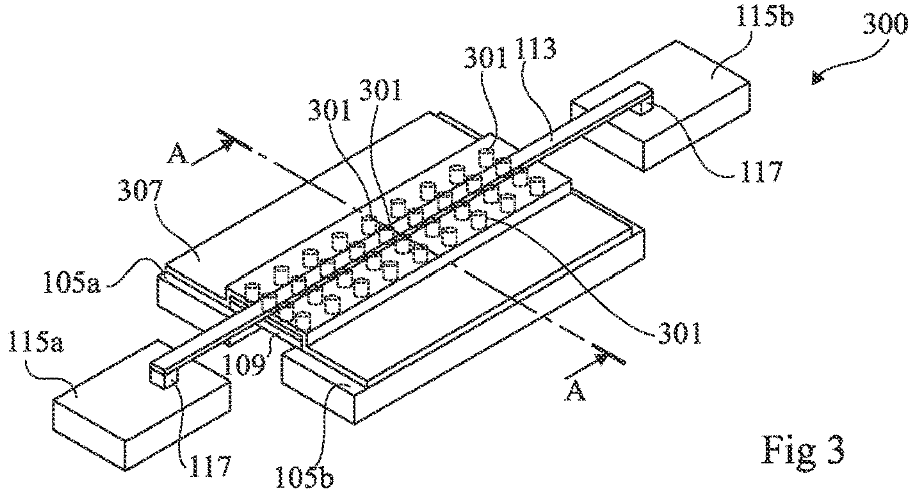
FIG. 3 is a simplified and partial perspective view of an example of a switch based on a phase-change material according to an embodiment.
Figure 4:
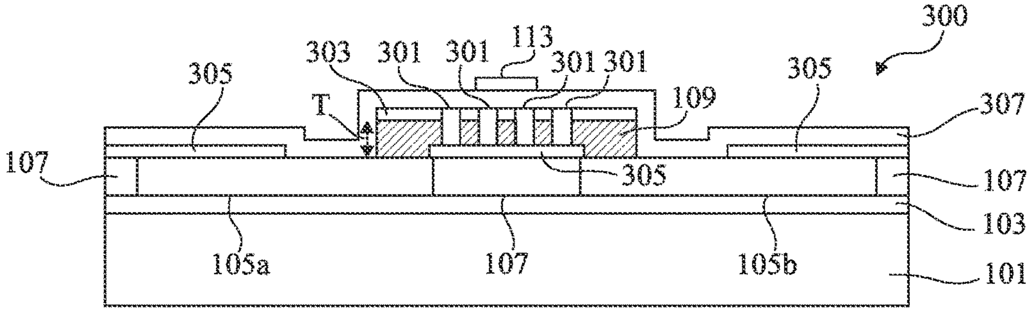
FIG. 4 is a cross-section view, along plane AA of FIG. 3, of the switch of FIG. 3.

FIG. 3 is a partial and simplified perspective view of an example of a switch 300 based on a phase-change material according to an embodiment. FIG. 4 is a cross-section view along plane AA of FIG. 3, of the switch 300 of FIG. 3. The switch 300 of FIGS. 3 and 4 comprises elements common with the switch 100 of FIGS. 1 and 2. These common elements will not be detailed again hereafter.

According to an embodiment, switch 300 comprises one or a plurality of pillar(s) 301 (several tens of pillars 301, in the shown example) extending in region 109 of phase-change material. More precisely, in the example illustrated in FIGS. 3 and 4, pillars 301 extend vertically through the entire thickness T of region 109.

According to an embodiment, pillar(s) 301 are made of a material having a thermal conductivity greater than that of the phase-change material of region 109. As an example, pillars 301 are made of an electrically insulating and thermally conductive material, for example, silicon nitride, aluminum nitride, etc. As a variant, pillars 301 may be made of an electrically and thermally conductive material, for example, a metal. However, for an implementation of switch 300 in radio frequency communication applications, the use of pillars 301 made of an electrically insulating material is preferred to limit or to avoid the occurrence of parasitic capacitive phenomena.

In the shown example, pillars 301 each have, in top view, a substantially circular cross-section. This example is however not limiting, and pillar(s) 301 may have any shape, for example, a cross-section of rectangular or square shape. As an example, each pillar 301 has a maximum lateral dimension (for example, a diameter, in the shown example where the pillars have a substantially circular cross-section) equal to approximately 300 nm. Further, each pillar 301 is for example separated from the neighboring pillars 301 by a distance in the order of 300 nm. Pillars 301 are for example distributed according to a periodic pattern. Although an example where switch 300 comprises a few tens of pillars 301 has been described, switch 300 may comprise any number of pillars 301.

An advantage resulting from the presence of pillars 301 lies in the fact that the heat generated by heating element 113 is more efficiently propagated in region 109 of switch 300. In particular, as compared with switch 100 having its region 109 mainly heated from its upper surface, the heat originating from the heating element 113 of switch 300 further diffuses at the heart of the phase-change material of region 109. Switch 300 thus has a thermal efficiency greater than that of switch 100.

In the case of switch 300, for a same control voltage applied between electrodes 115*a* and 115*b*, heating element 113 undergoes, with respect to switch 100, a lower temperature rise. Further, for a same control voltage, region 109 of switch 300 undergoes, with respect to region 109 of switch 100, a higher temperature rise. The differences between the temperatures respectively reached by heating element 113 and by region 109 during the switching steps is lower in the case of switch 300 than in the case of switch 100.

For comparable thicknesses T of region 109, switch 109 enables to access switching durations shorter than, or to switching speeds greater than, those of switch 100. It is advantageously possible to take advantage of the increased thermal efficiency of switch 300 to increase thickness T of region 109 with respect to switch 100, to decrease the figure of merit of switch 300, without degrading the switching durations with respect to switch 100. Heating element 113 can further advantageously be drawn away from region 109. This then causes a decrease in the off-state capacitance Con, and thus a decrease in the figure of merit, of switch 300 with respect to switch 100.

The upper surface of region 109 of switch 300 may be, as in the illustrated example, integrally coated with an electrically insulating layer 303. Optional layer 303 for example enables to passivate the upper surface of region 109. Layer 303 further enables to decrease the off-state capacitance Con of switch 300 with respect to switch 100, and thus to decrease the figure of merit of switch 300. In the shown example, pillars 301 cross layer 303 across its entire thickness. More precisely, in this example, each pillar 301 extends vertically from the upper surface of layer 303 to the lower surface of region 109. Layer 303 for example has a thickness in the range from 200 to 300 nm. As an example, layer 303 is made of silicon nitride or of germanium nitride (GeN).

In the illustrated example, switch 300 further optionally comprises separate electrically insulating regions 305 coating the upper surface of electrically insulating layer 107 and extending over a portion of the upper surface of each conduction electrode 105*a*, 105*b*. Each region 305 for example has a thickness in the order of 20 nm. As an example, electrically insulating regions 305 are made of a dielectric material, for example, silicon nitride.

To avoid overloading the drawing, substrate 101, electrically insulating layers 103 and 107, and electrically insulating regions 305 have not been shown in FIG. 3.

In the shown example, switch 300 further comprises an electrically insulating layer 307. The layer 307 of switch 300 is for example similar to the layer 111 of switch 100. In switch 300, layer 307 is interposed between layer 303 and heating element 113. More precisely, in the illustrated example, layer 307 coats the upper surface of pillars 301, the upper surface, and the sides of layer 303, the sides of region 109, the exposed portions of electrodes 105*a* and 105*b*, and the upper surface and the sides of regions 305. As an example, layer 307 is made of an electrically insulating and thermally conductive material, for example, the same material as that of pillars 301, for example, silicon nitride or aluminum nitride.

Although this has not been illustrated in the drawings, the structure of switch 300 may be coated, on the upper surface side of substrate 101, with a thermally insulating layer intended to confine the heat generated by heating element 113.

Switch 300 has a structure in which heating element 113 is more distant from substrate 101 than layer 109 of phase-change material. This implies a low thermal capacity, heating element 113 being capable of being located close to ambient air. This advantageously results in rapid thermal exchanges, and thus low switching durations.

Figure 5:
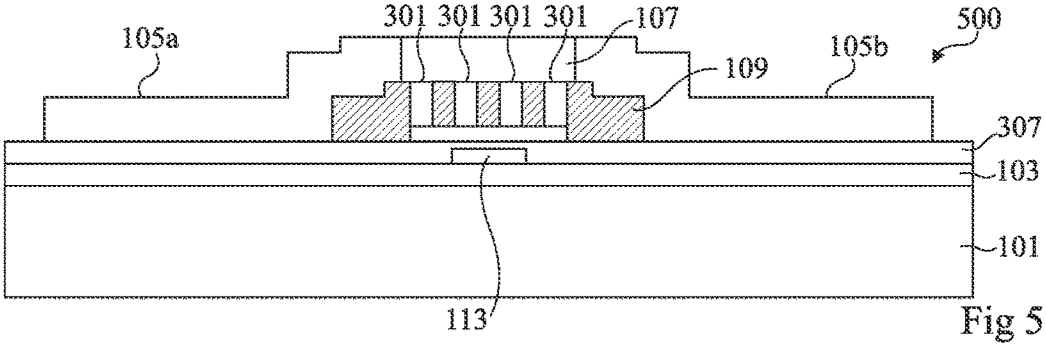
FIG. 5 is a simplified and partial perspective view of an example of a switch based on a phase-change material according to an embodiment.

FIG. 5 is a simplified and partial cross-section view of an example of a switch 500 based on a phase-change material according to an embodiment.

The switch 500 of FIG. 5 comprises elements common with the switch 300 of FIGS. 3 and 4. These common elements will not be described again hereafter. Conversely to the switch 300 of FIGS. 3 and 4, where region 109 of phase-change material is located under heating element 113, region 109 of switch 500 is, in the orientation of FIG. 5, located above heating element 113.

In the shown example, heating element 113 is more precisely on top of and in contact with the upper surface of electrically insulating layer 103. Further, in this example, electrically insulating layer 307 coats the upper surface and the sides of heating element 113 and further extends on portions of the upper surface of layer 103 not coated with heating element 113.

In the example illustrated in FIG. 5, region 109 of phase-change material, crossed by pillars 301, is located on top of and in contact with the upper surface of layer 307, vertically in line with heating element 113. In this example, the conduction electrodes 105*a* and 105*b* of switch 500 are on top of and in contact with the upper surface of layer 307. Further, electrodes 105*a* and 105*b* each coat a side and a portion of the upper surface of region 109.

In the shown example, electrically insulating layer 107 extends between electrodes 105*a* and 105*b*. Layer 107 is, in the orientation of FIG. 5, on top of and in contact with the upper surface of region 109.

Although this has not been illustrated in FIG. 5, switch 500 may further comprise a layer of passivation of region 109 and electrically insulating layers respectively similar to layer 303 and to regions 305 of the switch 300 of FIGS. 3 and 4.

As compared with switch 300, switch 500 has a structure where heating element 113 is closer to substrate 101. This implies, in the case of switch 500, a higher thermal capacity which favors the application of a lower control voltage on heating element 113, with respect to switch 300, to obtain a comparable rise of the temperature of region 109 during switchings.

Figure 6A:
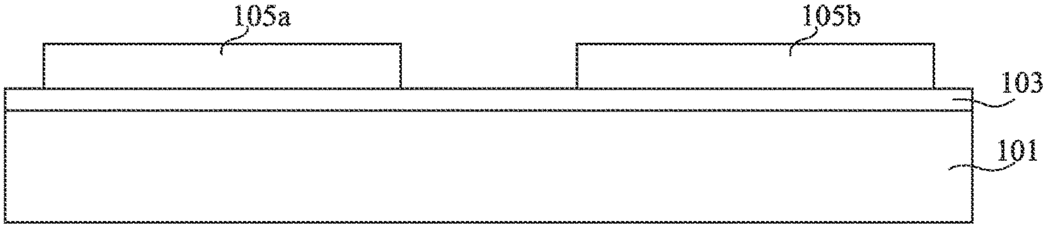
FIG. 6A, FIG. 6B, and FIG. 6C illustrate, in simplified and partial cross-section views, successive steps of an example of a method of manufacturing the switch of FIG. 3 according to an embodiment.
Figure 6B:
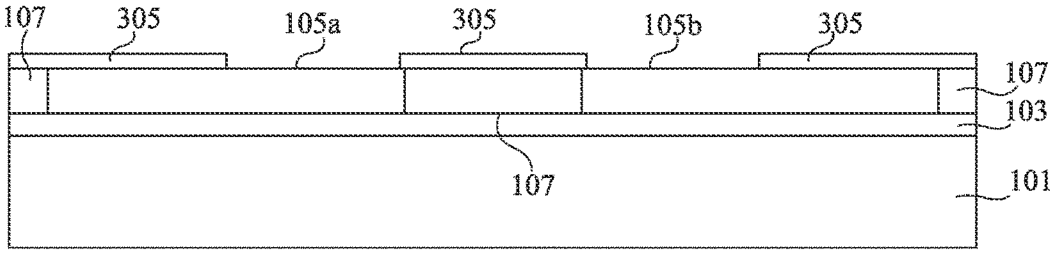
Figure 6C:
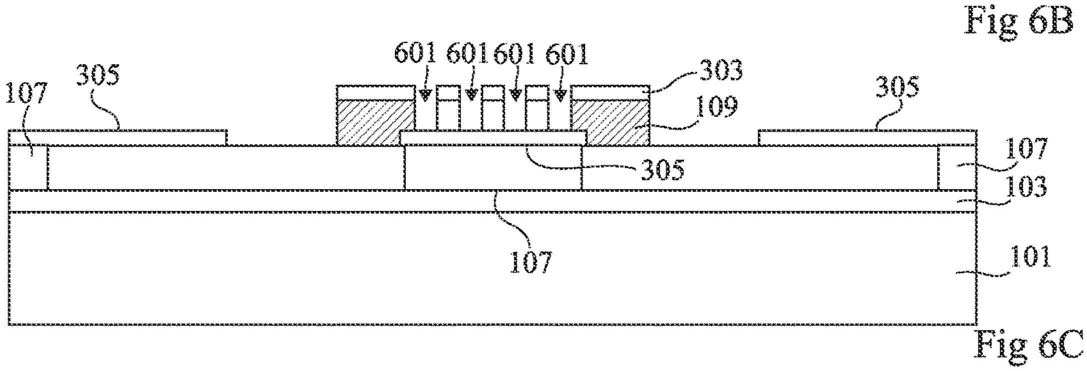

FIGS. 6A to 6C illustrate, in simplified and partial cross-section views, successive steps of an example of a method of manufacturing the switch 300 of FIG. 3 according to an embodiment.

FIG. 6A more precisely illustrates a step of forming of electrically insulating layer 103 on the upper surface of substrate 101, for example, by thermal oxidation of the material of substrate 101. FIG. 6A further illustrates a step of forming of conduction electrodes 105*a* and 105*b* on the upper surface of layer 103. As an example, a metallization level is first deposited, for example, by physical vapor deposition (PVD) of one or a plurality of metal layers, on the upper surface side of substrate 101. Steps of photolithography and etching then enable to only keep portions of the metallization level which are located at the desired locations of electrodes 105*a* and 105*b*. Radio frequency lines, not shown in FIG. 6A, may further be formed in the first metallization level during this step.

FIG. 6B illustrates a step of forming of electrically insulating layer 107 around electrodes 105*a* and 105*b*. As an example, layer 107 is first deposited, for example, by plasma-enhanced chemical vapor deposition (PECVD), for example, more precisely by high-density plasma-enhanced chemical vapor deposition (HDPCVD or HDP PECVD), on the upper surface side of the structure of FIG. 6A. Layer 107 may, after deposition, coat electrodes 105*a* and 105*b* and have a thickness for example in the order of 700 nm. A step of planarization, for example, by chemical mechanical polishing, then enables to expose the upper surfaces of electrodes 105*a* and 105*b*. Layer 107 for example then has a thickness substantially equal to that of electrodes 105*a* and 105*b*.

FIG. 6B further illustrates a step of forming of electrically insulating regions 305. As an example, an electrically insulating layer is first deposited on the upper surface side of substrate 101. Steps of photolithography and etching then enable to keep portions of the electrically insulating layer located at the desired locations of regions 305. As a variant, regions 305 may be formed by local deposition of an electrically insulating material on the upper surface side of substrate 101.

FIG. 6C illustrates a step of forming of region 109 of phase-change material and of passivation layer 303. As an example, a layer of phase-change material and a passivation layer are successively deposited, for example, by physical vapor deposition, on the upper surface side of the structure of FIG. 6B. Steps of photolithography and etching, for example, by reactive ion etching (RIE) or by ion beam etching (IBE), then enable to only keep portions of the layer of phase-change material and of the passivation layer at the desired locations of region 109 and of layer 303. During these steps, openings 601 may further be formed in the layer of phase-change material and in the passivation layer at the desired locations of pillars 301. As a variant, openings 601 may be formed after steps of photolithography and etching subsequent to the steps of forming of region 109 and of layer 303.

During another step, subsequent to the steps described in relation with FIG. 6C, openings 601 are integrally filled to form pillars 301. Electrically insulating layer 307 is then deposited over the entire upper surface of the structure. In the case where pillars 301 and layer 307 are made of the same material, pillars 301 are for example formed during the deposition of layer 307. Heating element 113 is then formed on top of and in contact with the upper surface of layer 307. Control electrodes 115*a* and 115*b* and pads 117 may further be formed during the step of forming of heating element 113, for example, from a same metallization level. At the end of these steps, the switch 300 of FIG. 3 is obtained.

Those skilled in the art are capable of adapting the method of manufacturing the switch 300 described hereabove in relation with FIGS. 6A to 6C to form switch 500.

Figure 7:
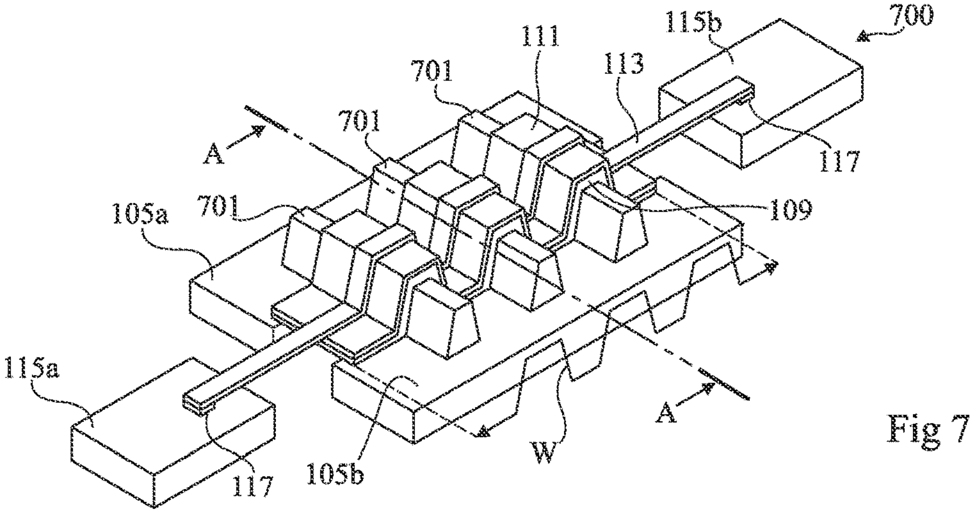
FIG. 7 is a simplified and partial perspective view of an example of a switch based on a phase-change material according to an embodiment.
Figure 8:
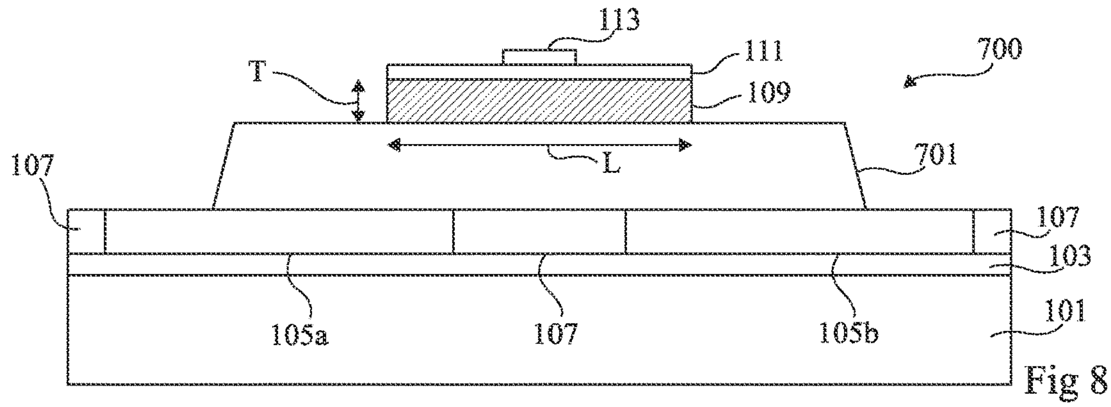
FIG. 8 is a cross-section view, along plane AA of FIG. 7, of the switch of FIG. 7.

FIG. 7 is a partial and simplified perspective view of an example of a switch 700 based on a phase-change material according to an embodiment. FIG. 8 is a cross-section view, along plane AA of FIG. 7, of the switch of FIG. 7. Plane AA of FIG. 7 is substantially parallel to a conduction direction of switch 700.

The switch 700 of FIGS. 7 and 8 comprises elements common with the switch 100 of FIGS. 1 and 2. These common elements will not be detailed again hereafter.

To avoid overloading the drawing, substrate 101 and electrically insulating layers 103 and 107 have not been shown in FIG. 7.

According to an embodiment, the switch 700 of FIGS. 7 and 8 comprises one or a plurality of electrically insulating islands 701 (three islands 701, in the shown example) each having a first surface (the lower surface, in the orientation of FIGS. 7 and 8) extending on top of and in contact with the first and second conduction electrodes 105*a* and 105*b* of switch 700. In switch 700, region 109 of phase-change material extends over a portion of the sides and over a portion of a second surface (the upper surface, in the orientation of FIGS. 7 and 8), opposite to the first surface, of each island 701. More precisely, in the shown example, region 109 coats a portion of the sides of islands 701 which are substantially parallel to plane AA of FIG. 7, that is, the sides of islands 701 extending along the conduction direction of switch 700. In the shown example, the heating element 113 of switch 700 further extends, along a direction orthogonal to the conduction direction of switch 700, on top of and in contact with a portion of the upper surface of region 109.

Islands 701 are made of a dielectric material or comprise a stack of dielectric materials. As an example, islands 701 are made of an electrically insulating and thermally conductive material, for example, a material having a thermal conductivity greater than that of the phase-change material of region 109, for example, aluminum nitride. This advantageously enables to obtain a lower thermal resistance between heating element 113 and region 109. A "quenching" phenomenon occurring during the transition of region 109 from the crystal phase to the amorphous phase is thus favored. As a variant, islands 701 may be made of silicon dioxide.

In the example illustrated in FIG. 7, each island 701 has an elongated shape along the conduction direction of switch 700 and a cross-section of substantially trapezoidal shape, the first surface of each island 701 having a surface area greater than the second surface area. The fact of providing islands 701 having a trapezoidal cross-section, the sides of islands 701 thus being inclined, advantageously enables to facilitate the coating of islands 701 with region 109 with respect to a case where islands 701 would have vertical sides, perpendicular to the first and second surfaces. The example illustrated in FIG. 7 is however not limiting, each island 701 being as a variant capable of having a cross-section of any shape, for example, rectangular or square. Islands 701 are for example distributed at regular intervals along the heating element (113).

In the switch 700 of FIG. 7, region 109 of phase-change material is developed on a three-dimensional structure, or in relief, conversely to switch 100 where region 109 is substantially planar. This advantageously enables to increase the width W of region 109 of phase-change material and/or to decrease the outer dimensions of the switch.

More precisely, switch 700 may have, as compared with switch 100, a shorter distance between its control electrodes 115*a* and 115*b* while keeping a region 109 having a width W substantially equal to that of region 109 of switch 100. This advantageously enables switch 700 to have smaller outer dimensions, and thus a higher integration density, as compared with switch 100.

As an example, in a case where switch 700 comprises two islands 701 having a height in the order of 5 μm, a width, corresponding to an average lateral dimension of island 701 measured along a direction perpendicular to plane AA of FIG. 7 (direction parallel to the axis of heating element 113), in the order of 1 μm and a spacing in the order of 1 μm, the width W of region 109, developed on the three-dimensional structure, is in the order of 25 inn Switch 700 has in this case a width, substantially corresponding to a dimension of conduction electrodes 105*a* and 105*b* taken orthogonally to plane AA of FIG. 7, in the order of 5 μm. As a comparison, the width of switch 100 is in the order of 25 inn in a case where its region 109 has a width equal to approximately 25 inn.

As a variant, it may be provided for region 109 of switch 700 to have a width W greater than that of region 109 of switch 100, while keeping a distance between electrodes 115*a* and 115*b* smaller than or equal to the distance between electrodes 115*a* and 115*b* of switch 100. This advantageously enables switch 700 to have a lower on-state resistance $R_{ON}$, and thus a lower figure of merit, as compared with switch 100.

As a variant, it may be provided for region 109 of switch 700 to have a width W greater and a thickness T smaller than that of region 109 of switch 100, while keeping a comparable on-state resistance $R_{ON}$. The fact of decreasing the thickness T of region 109 advantageously enables to obtain faster phase changes during switchings. Further, the decrease of the thickness T of region 109 enables to obtain a phase-change material of better crystal and stoichiometric quality. Thereby, the phase changes of the material of region 109 advantageously require less energy. The thermal efficiency of switch 700 is thus improved with respect to switch 100.

Another advantage of switch 700 lies in the fact that the presence of islands 701 enables to decrease the off-state capacitance $C_{OFF}$. Islands 701 more precisely enable to decrease a parasitic capacitance Cp between heating element 113 and the conduction electrodes 105*a* and 105*b* of switch 700, due to the fact that each island 701 draws heating element 113 away from electrodes 105*a* and 105*b*. Off-state capacitance $C_{OFF}$ is further decreased, with respect to switch 100, in a case where the width of switch 700 is smaller than that of switch 100.

Another advantage of switch 700 lies in the fact that the presence of islands 701 enables, for an identical width W, to decrease the inductance of heating element 113 with respect to the case of switch 100. This seems to be due to the fact that the mutual inductance between adjacent vertical sections of heating element 113 becomes negative, thus causing a decrease in the total inductance. An inductance decrease of heating element 113 advantageously enables to reach higher switching speeds.

Although this has not been illustrated in FIGS. 7 and 8, switch 700 may comprise a passivation layer and insulating regions identical or similar to the passivation layer 303 and to the regions 305 of the switch 300 of FIGS. 3 and 4.

Figure 9:
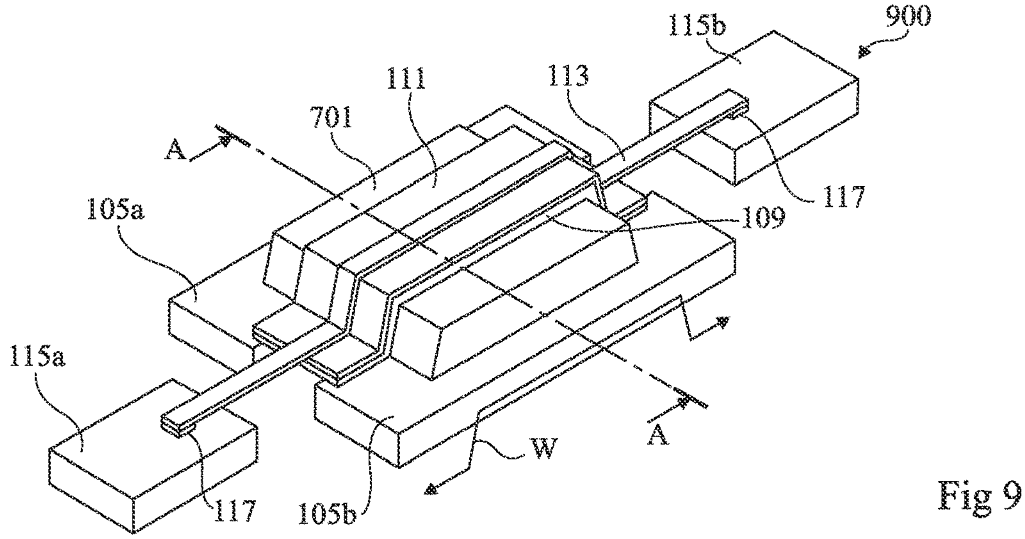
FIG. 9 is a simplified and partial perspective view of an example of a switch based on a phase-change material according to an embodiment.

FIG. 9 is a partial and simplified perspective view of an example of a switch 900 based on a phase-change material according to an embodiment.

The switch 900 of FIG. 9 comprises elements common with the switch 700 of FIGS. 7 and 8. These common elements will not be described again hereafter.

To avoid overloading the drawing, substrate 101 and electrically insulating layers 103 and 107 have not been shown in FIG. 9.

The switch 900 of FIG. 9 differs from the switch 700 of FIGS. 7 and 8 in that switch 900 comprises a single island 701 interposed between region 109 of phase-change material and conduction electrodes 105*a* and 105*b*.

Switch 900 has, in cross-section view along plane AA of FIG. 9, a structure similar to that previously discussed in relation with FIG. 8.

In switch 900, island 701 has dimensions, in particular, a width, such that the majority of region 109 coats island 701. This advantageously enables to take heating element 113 further away from conduction electrodes 105*a* and 105*b*, and thus to decrease the off-state capacitance Con of switch 800 with respect to switch 700.

Figure 10:
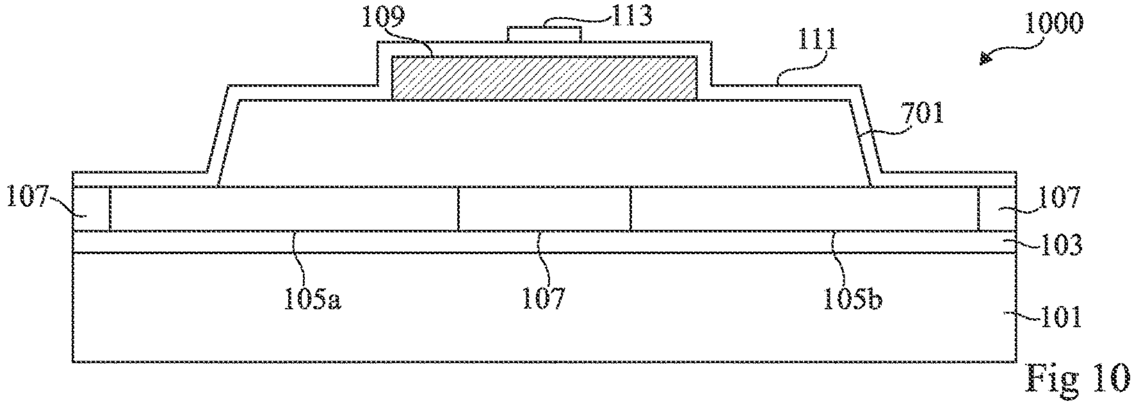
FIG. 10 is a simplified and partial perspective view of an example of a switch based on a phase-change material according to an embodiment.

FIG. 10 is a simplified and partial cross-section view of an example of a switch 1000 based on a phase-change material according to an embodiment.

The switch 1000 of FIG. 10 comprises elements common with the switch 700 of FIGS. 7 and 8. These common elements will not be detailed again hereafter.

The switch 1000 of FIG. 10 differs from the switch 700 of FIGS. 7 and 8 in that, in switch 1000, electrically insulating layer 111 extends over the entire upper surface of the structure. In the shown example, electrically insulating layer 111 coats region 109 of phase-change material and islands 701 of dielectric material. More precisely, in this example, layer 111 coats the upper surface and the sides of region 109 of phase-change material, portions of the upper surface of each island 701 not coated with region 109, all the sides of each island 701, portions of the upper surface of each conduction electrode 105*a*, 105*b* not coated with islands 701, and portions of the upper surface of electrically insulating layer 107 not coated with islands 701.

The fact of providing for layer 111 to cover the entire structure enables to simplify the manufacturing of switch 1000, particularly as compared with switches 700 and 900.

Figure 11:
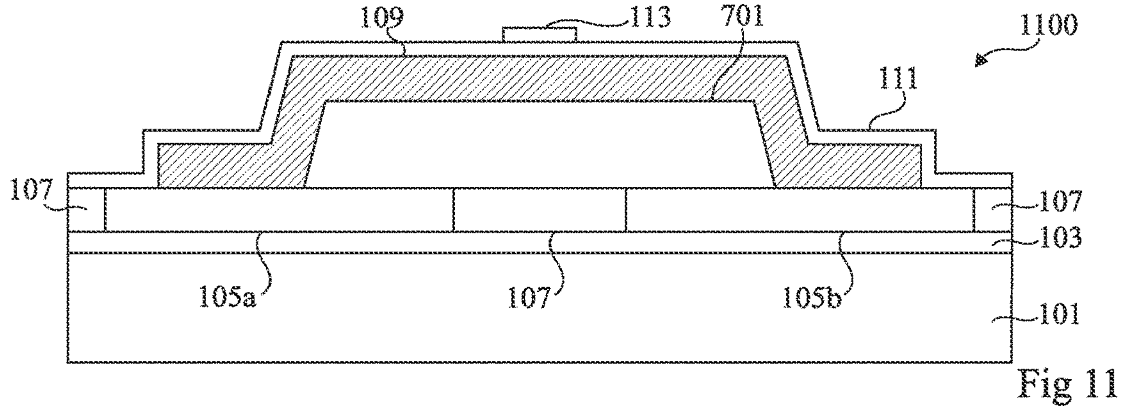
FIG. 11 is a simplified and partial perspective view of an example of a switch based on a phase-change material according to an embodiment.

FIG. 11 is a simplified and partial cross-section view of an example of a switch 1100 based on a phase-change material according to an embodiment.

The switch 1100 of FIG. 11 comprises elements common with the switch 700 of FIGS. 7 and 8. These common elements will not be detailed again hereafter.

The switch 1100 of FIG. 11 differs from the switch 700 of FIGS. 7 and 8 in that, in switch 1100, region 109 of phase-change material coats each island 701 of dielectric material and electrically insulating layer 111 extends over the entire upper surface of the structure. More precisely, in the shown example, region 109 of phase-change material coats the upper surface and all the sides of each island 701 and further extends on top of and in contact with a portion of the upper surface of each conduction electrode 105*a*, 105*b* of switch 1100. Further, in this example, layer 111 coats the upper surface and the sides of region 109 of phase-change material, portions of the upper surface of each conduction electrode 105*a*, 105*b* not coated with region 109, and portions of the upper surface of electrically insulating layer 107 not coated with islands 701.

In switch 1100, the portion of region 109 extending on top of and in contact with conduction electrodes 105*a* and 105*b* advantageously provides a better electric contact between region 109 of phase-change material and electrodes 105*a* and 105*b* than in switches 700, 900, and 1000. This further enables to simplify the manufacturing of switch 1100, particularly as compared with switches 700, 900, and 1000. Those skilled in the art are capable of adapting the embodiments of the switches 1000 and 1100 described in relation with FIGS. 10 and 11 to switches comprising any number of islands 701.

Figure 12A:
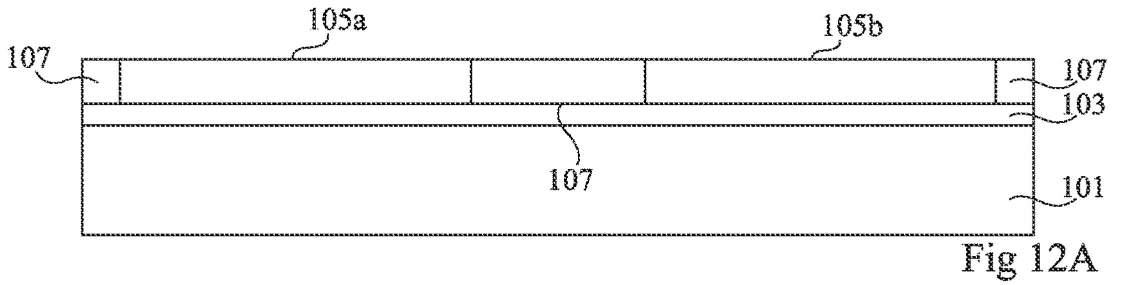
FIG. 12A and FIG. 12B illustrate, in simplified and partial cross-section views, successive steps of an example of a method of manufacturing a switch based on a phase-change material according to an embodiment.
Figure 12B:
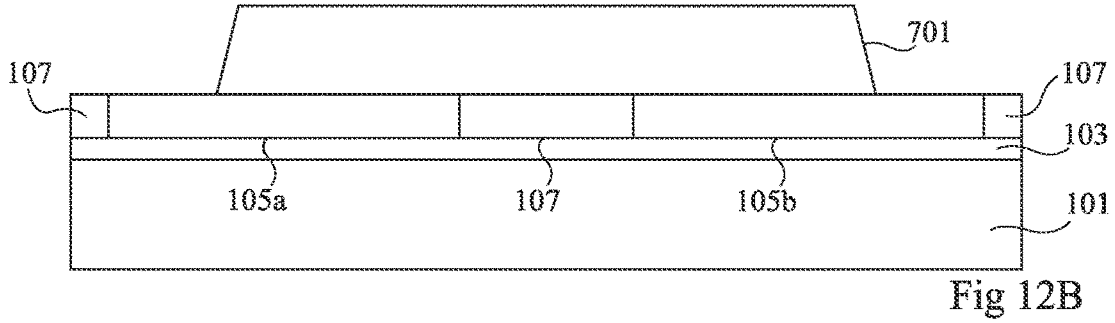

FIGS. 12A and 12B illustrate, in simplified and partial cross-section views, successive steps of an example of a method of manufacturing a switch based on a phase-change material according to an embodiment, for example, the switch 700 of FIG. 7.

FIG. 12A more precisely illustrates a structure obtained at the end of successive steps of forming of electrically insulating layer 103, of forming of control electrodes 105*a* and 105*b*, and of deposition and planarization of layer 107. These steps are for example implemented identically or similarly to what has been previously discussed in relation with FIG. 6A.

FIG. 12B illustrates a step of forming of islands 701 on the upper surface side of the structure. As an example, an aluminum nitride layer or a stack comprising an aluminum nitride layer and a silicon dioxide layer is first deposited, for example, by plasma-enhanced chemical vapor deposition (PECVD) on the upper surface side of the structure of FIG. 12A. Steps of photolithography and etching then enable to only keep portions of the layer or of the stack which are located at the desired locations of islands 701.

During subsequent steps, the phase-change material is deposited on the upper surface side of substrate 101. An optional passivation layer identical or similar to layer 303 of switch 300 may be deposited on the phase-change material to protect it against oxidation. Steps of photolithography and etching then enable to keep the phase-change material, and possibly the material of the optional passivation layer, at the desired location of region 109.

The deposition of layer 111 can then be performed, for example by forming a silicon nitride layer by plasma-enhanced chemical vapor deposition (PECVD) or an aluminum nitride layer by physical vapor deposition (PVD). In the case where electrically insulating layer 111 coats electrodes 105*a* and 105*b*, openings may then be formed, for example, by photolithography and etching, for example, reactive ion etching (RIE), in layer 111 to expose portions of the upper surface of each electrode 105*a*, 105*b*.

Heating element 113 may then be formed, for example, by a step of deposition of a metallization level on the upper surface side of substrate 101, followed by steps of photolithography and etching. During this step, conductive vias may further be formed in the previously-formed openings to recover the contacts of electrodes 105*a* and 105*b* of the switch.

Those skilled in the art are capable of adapting the method of manufacturing the switch 700 described hereabove in relation with FIGS. 12A and 12B to form switches 900, 1000, and 1100.

The embodiments of switches 300 and 500 previously discussed in relation with FIGS. 3 to 5 may be combined with the embodiments of switches 700, 900, 1000, and 1100 of FIGS. 7 to 11. More precisely, it may be provided to form, in the region 109 of phase-change material of switches 700, 900, 1000, and 1100, pillars identical or similar to the pillars 301 of switch 300. The structure of switches 700, 900, 1000, and 1100 may further be modified to obtain a structure similar to that of switch 500, where heating element 113 is interposed between substrate 101 and conduction electrodes 105*a* and 105*b*. Those skilled in the art are capable of adapting the method of manufacturing switch 700 described hereabove in relation with FIGS. 12A and 12B to form these different structures.

FIGS. 13A to 13D illustrate, in simplified and partial cross-section views, successive steps of an example of a method of manufacturing a switch 1300 based on a phase-change material according to an embodiment.

Switch 1300 comprises elements common with the switch 100 of FIGS. 1 and 2. These common elements will not be detailed again hereafter.

Figure 13A:
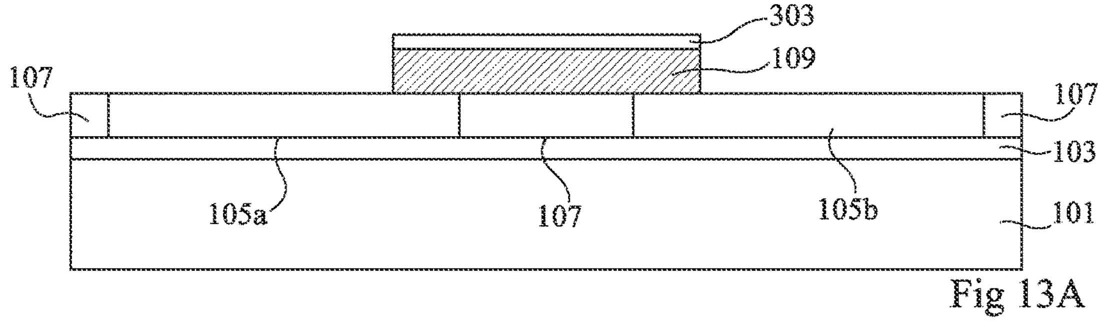
FIG. 13A, FIG. 13B, FIG. 13C, and FIG. 13D illustrate, in simplified and partial cross-section views, successive steps of an example of a method of manufacturing a switch based on a phase-change material according to an embodiment.

FIG. 13A more precisely illustrates a structure obtained after steps of forming of electrically insulating layer 103, on the upper surface side of substrate 101, of forming of conduction electrodes 105*a* and 105*b*, and of deposition and planarization of layer 107. These steps are for example implemented as previously discussed in relation with FIGS. 6A and 6B. Steps of forming of region 109 of phase-change material and of passivation layer 303 are then implemented, for example, as previously discussed in relation with FIG. 6B.

Figure 13B:
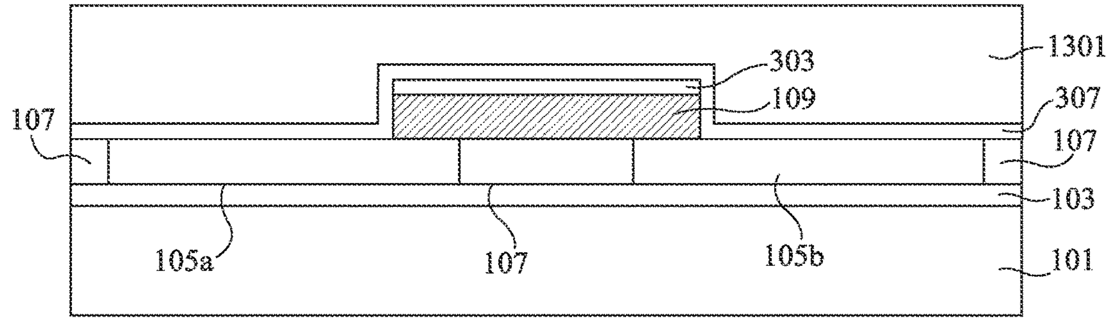

FIG. 13B more precisely illustrates a structure obtained at the end of a step of deposition of electrically insulating layer 307 on the upper surface side of the structure of FIG. 13A, followed by a step of deposition of another electrically insulating layer 1301 coating layer 307. Layer 1301 is for example then planarized, for example, by chemical mechanical polishing, to obtain a structure having a planar upper surface. As an example, layer 1301 is made of silicon dioxide or of aluminum nitride.

Figure 13C:
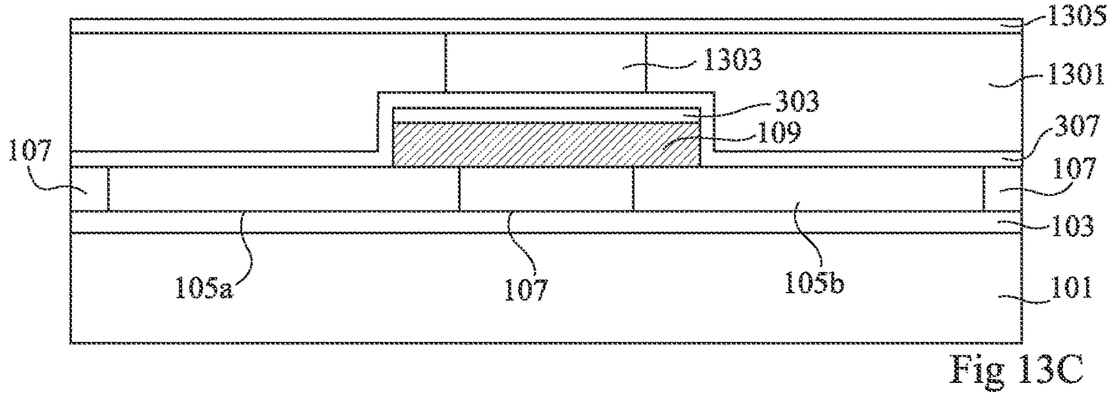

FIG. 13C more precisely illustrates a structure obtained at the end of a step of forming of a heating element 1303 on top of and in contact with the upper surface of layer 307, vertically in line with region 109. Heating element 1303 is for example identical or similar to the heating element 113 of switch 100. During this step, an opening is for example formed in layer 1301, for example by photolithography and etching, at the desired location of heating element 1303. The opening is then integrally filled with the material(s) of heating element 1303 after which a step of planarization, for example, by chemical mechanical polishing, is implemented to obtain a structure having a planar upper surface, heating element 1303 being flush with the upper surface of layer 1301. A subsequent step of deposition of an electrically insulating layer 1305 on the upper surface side of the structure is then implemented. Layer 1305 more precisely coats the upper surface of layer 1301 and the upper surface of heating element 1303. As an example, layer 1305 is made of aluminum nitride.

Figure 13D:
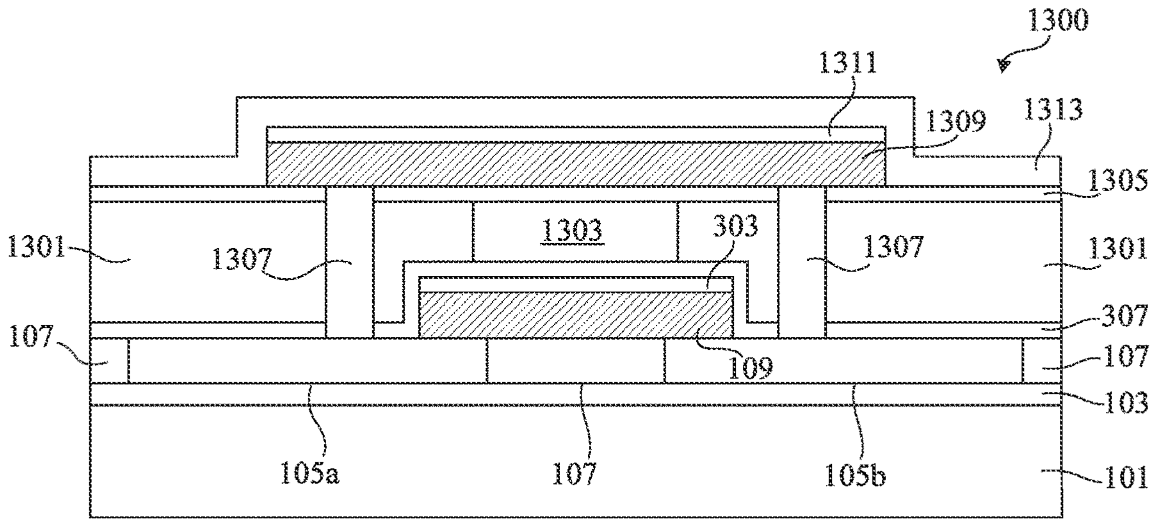

FIG. 13D more precisely illustrates the structure of switch 1300 obtained at the end of successive steps of forming of conductive vias 1307, each vertically extending from the upper surface of layer 1305 to the upper surface of one of the conduction electrodes 105*a*, 105*b* of switch 1300, of forming of another region 1309 of phase-change material coated with another passivation layer 1311, and of deposition of an electrically insulating layer 1313 on the upper surface side of the structure.

Conductive vias 1307 are for example formed by forming openings through the entire thickness of layers 1305, 1301, and 307 to expose a portion of the upper surface of each electrode 105*a*, 105*b*, for example, by photolithography and etching, at the desired locations of vias 1307. The openings are then integrally filled with the material of conductive vias 1307, and then a step of planarization, for example, by chemical mechanical polishing, is implemented to obtain a structure having a planar upper surface, conductive vias 1307 being flush with the upper surface of layer 1305. As an example, conductive vias 1307 are made of tungsten.

Region 1309 and layer 1311 are for example formed as previously discussed, for example, in relation with FIG. 6C, for region 109 and layer 303. As an example, region 1309 and layer 1311 are respectively made of the same materials as region 109 and layer 303.

In the shown example, layer 1313 coats the upper surface and the sides of layer 1311, the sides of region 1309, and portions of the upper surface of layer 1305 not coated with region 1309. Layer 1313 for example enables to passivate switch 1300 to protect it against oxidation.

Regions 109 and 1309 of phase-change material are each connected to one of conduction electrodes 105*a* and 105*b* by means of conductive vias 1307, region 1309 being, in the orientation of FIG. 13D, located above region 109. Heating element 1303, located between regions 109 and 1309, is electrically insulated from region 109 by layer 307 and from region 1309 by layer 1305.

The regions 109 and 1309 of phase-change material of switch 1300 may each have a thickness twice smaller than the thickness T of layer 109 of switch 100 while enabling switch 1300 to keep an on-state resistance $R_{ON}$ substantially equal to that of switch 100. This advantageously enables regions 109 and 1309 to have a better crystal quality. The use of regions 109 and 1309 thinner than the region 109 of switch 100 further advantageously enables switch 1300 to reach higher switching speeds, the surface of the phase-change material exposed to heat generated by the heating element being, in switch 1300, substantially doubled with respect to switch 100, for a comparable cumulated thickness of phase-change material. This enables switch 1300 to have a better energy performance than switch 100, the energy necessary for the phase change of the material of regions 109 and 1309 being lower.

Figure 14A:
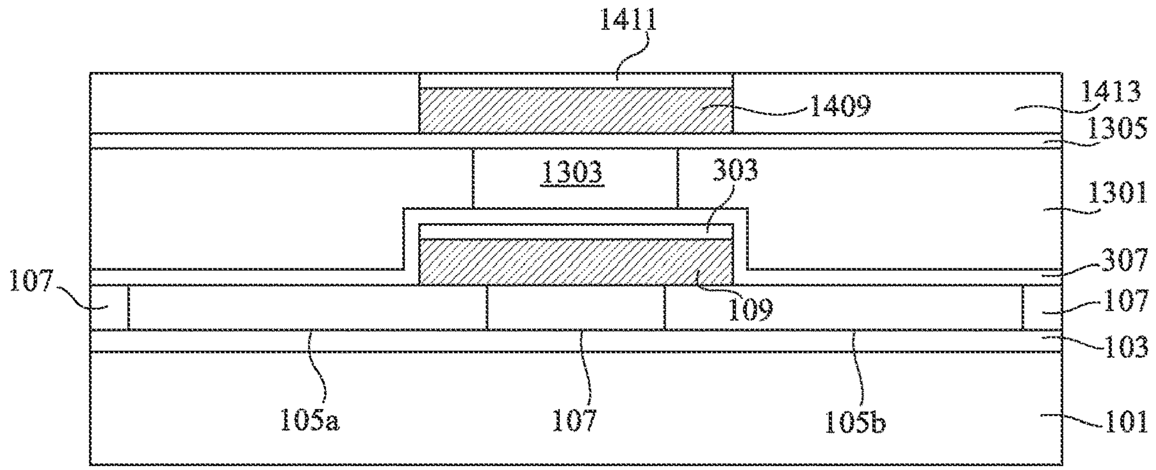
FIG. 14A and FIG. 14B illustrate, in simplified and partial cross-section views, successive steps of an example of a method of manufacturing a switch based on a phase-change material according to an embodiment.
Figure 14B:
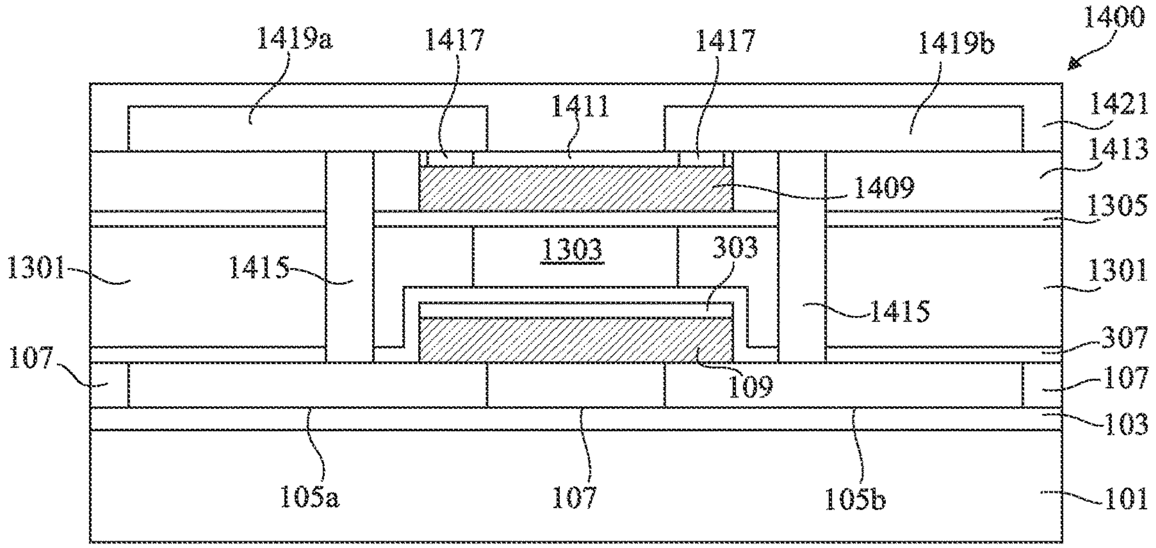

FIGS. 14A and 14B illustrate, in simplified and partial cross-section views, successive steps of an example of a method of manufacturing a switch 1400 based on a phase-change material according to an embodiment.

FIG. 14A more precisely illustrates a structure obtained, for example from the structure previously described in relation with FIG. 13C, after steps of forming, on top of and in contact with the upper surface of layer 1305, of another region 1409 of phase-change material coated with another passivation layer 1411, and of deposition of an electrically insulating layer 1413 on the upper surface side of the structure.

Region 1409 and layer 1411 are for example formed as previously discussed, for example, in relation with FIG. 6C, for region 109 and layer 303. As an example, region 1409 and layer 1411 are respectively made of the same materials as region 109 and layer 303.

As an example, layer 1413 is first deposited on the upper surface side of the structure after the forming of region 1409 and of layer 1411. Layer 1413 may for example, after deposition, coat the sides of region 1409 and the upper surface and the sides of layer 1411. A step of planarization, for example, by chemical mechanical polishing, then enables to expose the upper surface of layer 1411. After planarization, layer 1413 is for example flush with the upper surface of layer 1411 as in the example illustrated in FIG. 14A.

FIG. 14B more precisely illustrates a structure obtained at the end of a step of forming of conductive vias 1415, each extending vertically from the upper face of layer 1413 to the upper surface of one of conduction electrodes 105*a*, 105*b*, of a step of forming of other conductive vias 1417, each extending vertically from the upper surface of layer 1411 to the upper surface of region 1409 close to two opposite sides of region 1409, of a step of forming of two conduction electrodes 1419*a* and 1419*b*, respectively connected to conduction electrodes 105*a* and 105*b*, and of a step of deposition of an electrically insulating layer 1421 on the upper surface side of the structure.

Conductive vias 1415 are for example formed by forming openings through the entire thickness of layers 1413, 1305, 1301, and 307 to expose a portion of the upper surface of each electrode 105*a*, 105*b*, for example, by photolithography and etching, at the desired locations of vias 1415. The openings are then integrally filled with the material of conductive vias 1415. Similarly, conductive vias 1417 are for example formed by forming openings through the entire thickness of layer 1411 to expose portions of the upper surface of layer 1409, for example, by photolithography and etching at the desired locations of vias 1417. A step of planarization, for example, by chemical mechanical polishing, is for example then implemented to obtain a structure having a planar upper surface, conductive vias 1415 and 1417 being flush with the upper surface of layer 1413. As an example, conductive vias 1415 and 1417 are made of tungsten.

Electrodes 1419*a* and 1419*b* are for example formed similarly to what has been discussed in relation with FIG. 6A for electrodes 105*a* and 105*b*. Each of electrodes 1419*a*, 1419*b* is connected to the corresponding electrode 105*a*, 105*b* by one of conductive vias 1415, and to region 1409 by one of vias 1417. As an example, electrodes 1419*a* and 1419*b* are made of the same material, or comprise the same stack of layers of materials, as electrodes 105*a* and 105*b*.

As an example, layer 1421 is deposited on the upper surface side of the structure after the forming of electrodes 1419*a* and 1419*b*. Layer 1413 may for example, after deposition, coat the upper surface and the sides of electrodes 1419*a* and 1419*b*. A step of planarization, for example, by chemical mechanical polishing, then enables to obtain a structure having a planar upper surface.

Switch 1400 has advantages identical or similar to those of switch 1300.

Although there has been illustrated in relation with FIGS. 14A and 14B an implementation mode of a method of manufacturing a switch comprising two regions 109 and 1409 of phase-change material, those skilled in the art would be capable of adapting this method to form switches comprising a number of regions of phase-change material greater than two, that is, a structure comprising an alternation of layers of phase-change material and of heating elements. This would enable to further decrease the thickness of each region of phase-change material with respect to switch 100 while keeping a similar on-state resistance $R_{ON}$.

The embodiments of switches 1300 and 1400 previously discussed in relation with FIGS. 13D and 14B may be combined with the embodiment of the switch 300 of FIG. 3. In particular, it may be provided for one of the regions 109, 1309, 1409 of phase-change material of switches 1300 and 1400 to comprise one or a plurality of pillars, similar to the pillars 301 of switch 300, extending in the region of phase-change material, the pillar(s) being made of a material having a thermal conductivity greater than that of the phase-change material. Switches 1300 and 1400 would thus benefit from advantages similar to those of switch 300.

The embodiments of the switches 1300 and 1400 previously discussed in relation with FIGS. 13D and 14B may further be combined with the embodiments of the switches 700, 900, 1000, and 1100 of FIGS. 7, 9, 10, and 11. In particular, it may be provided for at least one of the regions 109, 1309, 1409 of phase-change material of switches 1300 and 1400 to be developed on a three-dimensional surface comprising at least one island identical or similar to islands 701.

Those skilled in the art are capable of adapting the method of manufacturing the switch 1300 described hereabove in relation with FIGS. 13A to 13D and the method of manufacturing the switch 1400 described hereafter in relation with FIGS. 14A and 14D to form these different structures.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove. In particular, the described embodiments are not limited to the specific examples of materials and of dimensions mentioned in the present disclosure.

Switch based on a phase-change material may be summarized as including: first and second regions (109, 1309; 109, 1409) of said phase-change material each connected to first and second conduction electrodes (105*a*, 105*b*) of the switch, the second region being located above the first region; and a heating element (1303) located between first and second regions of said phase-change material and electrically insulated from the first and second regions of said phase-change material.

A region (109), among the first and second regions of said phase-change material, may be on top of and in contact with the first and second electrodes (105*a*, 105*b*).

The other region (1309) of said phase-change material may be connected to the first and second electrodes by vias (1307).

Said vias (1307) may be in contact, by their upper surface, with the lower surface of said other region (1309) of said phase-change material.

The other region (1409) of said phase-change material may be under and in contact with third and fourth electrodes (1419*a*, 1419*b*).

The third and fourth electrodes may be respectively connected to the first and second electrodes by vias (1415).

Said phase-change material may be a chalcogenide material.

The heating element (1303) may be made of a metal or of a metal alloy.

The heating element (1303) may be made of tungsten or of titanium nitride.

Switch may further include one or a plurality of pillars (301) extending in the first region (109, 1309) of said phase-change material, the pillar(s) being made of a material having a thermal conductivity greater than that of said phase-change material.

Switch may further include one or a plurality of pillars (301) extending in the second region (109, 1409) of said phase-change material, the pillar(s) being made of a material having a thermal conductivity greater than that of said phase-change material.

The material of the pillar(s) (301) may be electrically insulating.

Each pillar (301) may have a maximum lateral dimension equal to approximately 300 nm.

Method of manufacturing a switch may be summarized as including the successive steps of: a) deposition of the first region (109) of said phase-change material; b) forming of the heating element (1303); and c) deposition of the second region (1309; 1409) of said phase-change material.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:

a switch that includes a phase-change material, the switch including:
- first and second conduction electrodes;
- first and second regions of the phase-change material each coupled to the first and second conduction electrodes of the switch, the second region being located above the first region; and
- a heating element between the first and second regions of the phase-change material and electrically insulated from the first and second regions of the phase-change material; and a first plurality of pillars extending in the first region of the phase-change material, the first plurality of pillars being made of a material having a thermal conductivity greater than that of the phase-change material.

2. The device according to claim 1, wherein the first region is on top of and in contact with the first and second electrodes.

3. The device according to claim 2, wherein the second region is coupled to the first and second electrodes by vias.

4. The device according to claim 3, wherein the vias are in contact, by respective upper surfaces, with a lower surface of the second region of the phase-change material.

5. The device according to claim 2, wherein the second region of the phase-change material is under and in contact with third and fourth electrodes.

6. The device according to claim 5, wherein the third and fourth electrodes are respectively coupled to the first and second electrodes by vias.

7. The device according to claim 1, wherein the heating element is tungsten.

8. The device according to claim 1, comprising a second plurality of pillars extending in the second region of the phase-change material, the second plurality of pillars being made of the material having the thermal conductivity greater than that of the phase-change material.

9. A device, comprising:

a substrate;

a first and second electrode on the substrate;

a first phase change layer on the first and second electrode;

a heating element on the first phase change layer;

a second phase change layer on the heating element, the heating element being between the first and second phase change layers; and a plurality of pillars extending in the first phase change layer, the pillars being made of a material having a thermal conductivity greater than that of the first phase change layer.

10. The device of claim 9, comprising a third and fourth electrode on the second phase change layer.

11. The device of claim 10, comprising a first via between the third electrode and the first electrode.

12. The device of claim 11, comprising a second via between the fourth electrode and the second electrode.

13. A method, comprising;

forming a first and a second electrode on a substrate;

forming a first phase change layer on the first and second electrodes;

forming a heating element on the first phase change layer;

forming a second phase change layer on the heating element, the heating element being between the first and second phase change layers;

forming a first insulating layer on the first phase change layer; and forming a second insulating layer on the first insulating layer, on the first electrode, and on the second electrode.

14. The method of claim 13, wherein the forming the first and second electrodes includes forming the first electrode spaced from the second electrode by a dimension and forming the first phase change layer overlapping the first electrode, the second electrode, and completely over the dimension between the first and second electrodes.

15. The method of claim 13, comprising forming a third electrode and a fourth electrode on the second phase change layer.

16. The method of claim 15, comprising forming a first via coupling the third electrode to the first electrode and forming a second via coupling the fourth electrode to the second electrode.

17. The method of claim 13, comprising forming a plurality of pillars extending in the first phase change layer.

18. The method of claim 17, wherein the plurality of pillars includes a first material having a thermal conductivity greater than a second material of the first phase change layer.

19. The method of claim 18, wherein both the first phase change layer and the second phase change layer include the second material.

20. The method of claim 13, comprising forming a passivation layer on the first phase change layer.

* * * * *